United States Patent [19]
Liaw et al.

[11] Patent Number: 6,150,247
[45] Date of Patent: Nov. 21, 2000

[54] METHOD FOR MAKING POLYCIDE-TO-POLYCIDE LOW CONTACT RESISTANCE CONTACTS FOR INTERCONNECTIONS ON INTEGRATED CIRCUITS

[75] Inventors: Ing-Ruey Liaw; Meng-Jaw Cherng, both of Hsinchu, Taiwan

[73] Assignee: Vanguard International Semiconductor Corporation, Hsin-Chu, Taiwan

[21] Appl. No.: 08/590,548

[22] Filed: Mar. 19, 1996

[51] Int. Cl.$^7$ .................................................. H01L 21/3205
[52] U.S. Cl. .......................... 438/592; 438/647; 438/649; 438/655
[58] Field of Search .......................... 437/41 GS, 41 SM, 437/193, 200; 748/DIG. 19; 257/377, 413, 754, 755, 756, 757, 763; 438/592, 647, 649, 682, 683, 684, 655, 657

[56] References Cited

U.S. PATENT DOCUMENTS

| | | | |
|---|---|---|---|
| 5,223,456 | 6/1993 | Malwah | 437/200 |
| 5,338,701 | 8/1994 | Hsu et al. | 437/60 |
| 5,395,784 | 3/1995 | Lu et al. | 437/52 |
| 5,468,669 | 11/1995 | Lee et al. | 437/51 |

FOREIGN PATENT DOCUMENTS

| | | | |
|---|---|---|---|
| 5-198686 | 8/1993 | Japan | 437/200 |
| 5-243397 | 8/1993 | Japan | 257/755 |
| 5-335306 | 12/1993 | Japan | 257/755 |

OTHER PUBLICATIONS

Wolf, S., et al., Silicon Processing, vol. 1, 1986, Lattice Press, pp. 181–182, 384–386, 581.

*Primary Examiner*—T. N. Quach
*Attorney, Agent, or Firm*—George O. Saile; Stephen B. Ackerman

[57] ABSTRACT

A method for making interlevel contacts having low contact resistance ($R_c$) between patterned polycide layers is described. The method and resulting contact structure consists of depositing and conductively doping a first polysilicon layer having a first tungsten silicide ($WSi_2$) layer. The first polysilicon/silicide (first polycide) layer is patterned to form the first polycide interconnecting conducting layer. An insulating layer is deposited over the patterned first polycide layer and contact openings are anisotropically plasma etched in the insulating layer to the underlying polycide layer. The etching is continued to remove completely the first silicide layer in the contact openings, and to etch into the first polysilicon layer. After a brief hydrofluoric (HF) etch, a second doped polysilicon layer is deposited and patterned to form a second conducting interconnecting level over the contact openings. The second polysilicon-to-first polysilicon interface formed in the contacts results in consistently low contact resistance ($R_c$). This low $R_c$ is difficult to achieve in the prior art where the second level metallurgy contacts the first tungsten silicide of the first level interconnecting polycide layer.

7 Claims, 4 Drawing Sheets

FIG. 1 - Prior Art

METHOD FOR MAKING POLYCIDE-TO-POLYCIDE LOW CONTACT RESISTANCE CONTACTS FOR INTERCONNECTIONS ON INTEGRATED CIRCUITS

BACKGROUND OF THE INVENTION (1) Field of the Invention

The present invention relates to a method of making polycide-to-polycide contacts for multilevel interconnections on semiconductor integrated circuits, and more particularly relates to a method and structure for forming low-resistance contacts between interconnecting polycide layers.

(2) Description of the Prior Art

Advances in semiconductor processing technologies, such as advances in high-resolution photolithography and anisotropic plasma etching, continue to reduce the feature sizes of semiconductor devices. These reduced feature sizes include smaller contact openings leading to higher contact resistance. For example, current contact opening feature sizes are now typically less than 0.5 micrometer (um). The increase in this parasitic resistance in series with circuit devices, such as field effect transistors (FETs), degrade the circuit performance and therefore is undesirable. A further concern is wide distribution in contact resistance ($R_c$), which is also undesirable.

It is common practice in the semiconductor industry to interconnect the semiconductor devices by using multilayers of patterned heavily doped polysilicon/silicide layers, commonly referred to as polycide layers, and by metal layers to form the integrated circuits. Interlevel dielectric (ILD) layers, hereafter referred to as "insulating layers," having contact openings (via holes) between the polycide layers are used to electrically insulate the various polycide and metal layers on the substrate. On Ultra Large Scale Integration (ULSI) the number of contacts now well exceeds a million and it is important to have consistently low contact resistance ($R_c$) from contact to contact.

One method of providing consistently low contact resistance between aluminum metal levels, by the prior art, is to in-situ sputter clean the contact openings just prior to physical vapor depositing the next level of aluminum to avoid the aluminum oxide formation that readily forms during exposure to the ambient. Unfortunately, this requires retrofitting the deposition tool with a sputtering system and further complicates the process.

High contact resistance problems are also a concern between silicide/polysilicon (polycide) to silicide/polysilicon (polycide) layers that are also typically used to form part of semiconductor devices such as FET gate electrodes, word lines, bit lines, etc. on integrated circuits, such as dynamic random access memory (DRAM), static random access memory (SRAM), and microprocessors. A typical prior art contact between two tungsten silicide/polysilicon patterned layers is shown in FIG. 1. The contact structure is shown built on a semiconductor substrate 10 having an insulating layer 12 thereon. Shown is a first polycide layer composed of a first polysilicon layer 14 and a first silicide layer 16 comprised, in part, by the gate electrodes for an FET. The first polycide layer is then electrically insulated by depositing an insulating layer 20, for example, by a chemical vapor deposited (CVD) oxide. The contact openings 4 are then formed in the insulating layer 20 to the surface of the first silicide layer 16 by using conventional photolithographic techniques and anisotropic plasma etching. Still referring to FIG. 1, an undoped second polysilicon layer 21 is deposited over the insulating layer 20, and in the contact openings for making contact with the top surface of the first silicide layer 16. A doped polysilicon layer 24 is deposited on the undoped polysilicon layer 21. The undoped polysilicon layer 21 is used to prevent diffusion of dopants from polysilicon layer 24 into the substrate 10 when the contact is made over the cell contact regions (N$^-$), such as FET source/drain regions, to prevent deep junctions from forming. The second level of interconnecting metallurgies is now completed by depositing a second silicide layer 26. Layers 26, 24, and 21 are then patterned using conventional photolithographic and plasma etching to form the second patterned conducting layer.

Unfortunately, it is difficult to form consistently low contact resistance for the contacts, as in FIG. 1, because of the difficulty in removing residual polymers that occur during the etching of the contact openings, such as opening 4 in FIG. 1, and the subsequent removal of the photoresist contact mask. For example, contacts having minimum feature sizes of 0.5 um or less can have contacts with resistance that varies from as low as 100 ohms to values exceeding 2000 ohms. Furthermore, interface treatments, such as plasma etching in a gas mixture containing $CH_4$ and $O_2$ to treat the tungsten silicide surface, are not effective, even when portions of the top surface of the silicide layer 16 are partially removed. Alternatively, implant doping of the tungsten silicide layer 16 in the contact openings does not provide consistently low contact resistance.

Therefore, there is still a strong need in the semiconductor industry to further provide methods for forming contacts with low contact resistance for these interconnecting metallurgies, while eliminating the need for additional processing steps to reduce the resistance, and thereby providing a more cost-effective manufacturing process.

SUMMARY OF THE INVENTION

It is therefore a principal object of the present invention to provide a method and structure for forming electrical contacts between polycide layers having repeatable low contact resistance ($R_c$).

It is another object of this invention to provide the above structure while reducing the process complexity and thereby providing a more cost-effective manufacturing process.

In accordance with the above objectives, by a first embodiment, a method and a resulting structure for an electrical contact between patterned polycide layers having low contact resistance ($R_c$) for interconnections on integrated circuits are described. The method begins by providing a semiconductor substrate, such as single-crystal silicon wafers, having field oxide (FOX) regions surrounding and electrically isolating device areas. The most commonly used FOX is formed by the method of LOCal Oxidation of Silicon (LOCOS), in which a patterned silicon nitride layer over the device areas is used as a barrier to oxidation. The silicon substrate is thermally oxidized in the exposed field oxide areas to form a relatively thick silicon oxide ($SiO_2$). A first polysilicon layer is deposited on the substrate after forming a thin gate oxide in the device areas, and the polysilicon layer is N+ doped making it electrically conducting. A first silicide layer, such as tungsten silicide, is then deposited on the first polysilicon layer to form a polycide layer that further improves the conductivity. The polycide (polysilicon/silicide) layer is now patterned by using a photoresist mask and anisotropically etching to form, for example, FET gate electrodes over the device areas, and concurrently provide polycide interconnecting metallurgy over the field oxide regions. Although the method is described for making contacts to a first polycide layer used for FET gate electrodes, it should be well understood by those skilled in the art that the method is generally applicable to making low contact resistance contacts between any two polycide layers on the substrate. Typically after forming the gate electrodes, other process steps are employed to complete the FET. For example, forming lightly doped drains (LDD) by ion implantation, forming insulating sidewall spacers by anisotropically etching back, for example, a silicon oxide layer (CVD oxide) deposited over the gate electrodes, and then forming heavily doped FET source/drain contact areas. These process steps are carried out as commonly practiced in the industry and are not described in further detail to simplify the discussion of the invention.

Continuing with the invention, an insulating layer is deposited over the patterned first polycide layer to insulate the first polycide layer from the next level of interconnections. Typically, by the prior art, contact openings are etched in the insulating layer to the surface of the silicide layer on the underlying patterned polycide layer, generally resulting in contacts that have high contact resistance with wide variations in resistance values. By the method of this invention, a photoresist mask and anisotropic etching is used to etch the contact openings in the insulating layer and through the first silicide layer into the first polysilicon layer. The plasma etch is terminated after overetching partially into the first polysilicon layer. After forming these contact openings, by the method of this invention, a second polysilicon layer is deposited over the insulating layer and into the contact openings, making contact with the first polysilicon layer. The second polysilicon is now conductively doped, such as by implanting $p^{31}$ ions to form a first polysilicon/second polysilicon interface which provides much improved contacts having low contact resistance ($R_c$) and narrower distribution in resistance. The invention eliminates the need for additional processing complexity. For example, in-situ sputter cleaning would be difficult and more costly to implement. In addition, interface treatments like plasma etching in a gas mixture of $CH_4$ and $O_2$ or ion-implant doping the tungsten silicide layer are also not very effective and are difficult to control.

A second silicide layer is deposited on the second polysilicon layer forming a second polycide layer. Using conventional photolithography techniques and anisotropic plasma etching, the second polycide layer is patterned to complete the second level of interconnections having the improved contacts to the first polycide layer interconnections.

Further in accordance with this invention, a second embodiment is described which is similar to the first embodiment. In the second embodiment the contact openings are etched using a photoresist mask with the openings aligned over the field oxide regions. The contact openings are then etched in the insulating layer and are also etched through the patterned first silicide and polysilicon layers to the underlying field oxide (FOX) regions. The field oxide regions serve as an etch-stop layer thereby providing a greater latitude in forming the contact openings. The method continues by depositing a second polysilicon layer over the insulating layer and in the contact openings, and contacting the sidewalls of the first polysilicon layer. This provides a contact having a low contact resistance and tight distribution in resistance values. The multilevel polycide having these improved contacts is completed by depositing a second silicide layer over the second polysilicon layer, and both layers are patterned using conventional photolithographic techniques and anisotropic plasma etching to define a second level of interconnecting metallurgy.

BRIEF DESCRIPTION OF THE DRAWINGS

The objects and other advantages of the invention are best understood with reference to the preferred embodiments when read in conjunction with the following drawings.

DESCRIPTION OF THE PREFERRED EMBODIMENTS

Figure 1:
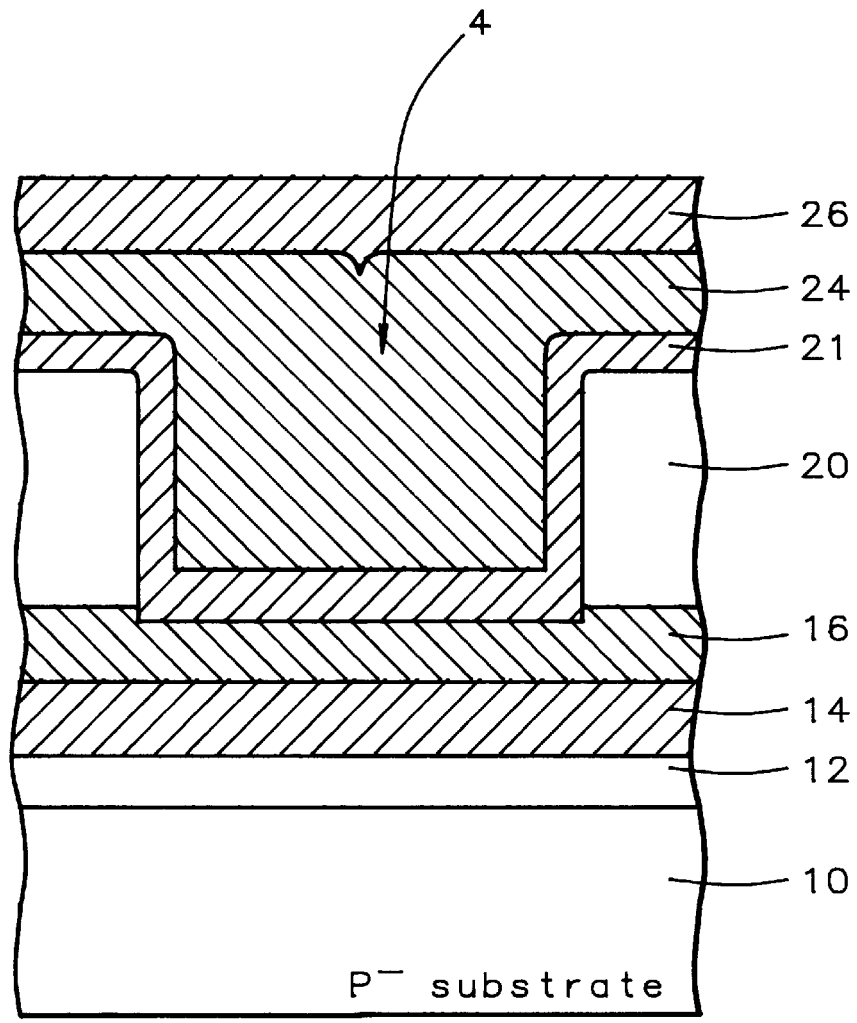
FIG. 1 shows a schematic cross-sectional view of the prior art in which a contact is formed between two polycide layers, where the polysilicon of the top (second) polycide layer contacts the silicide of the bottom polycide layer.
Figure 2:
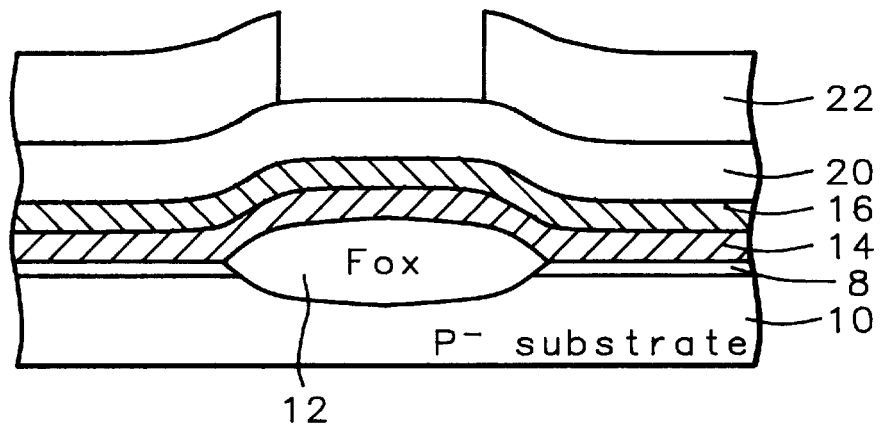
FIGS. 2 through 4 are cross-sectional, schematic drawings showing a first embodiment process and resulting structure for forming two levels of polycide inter-connections wherein the polysilicon of the top (second) polycide layer contacts the polysilicon layer of the bottom (first) polycide layer in the contact openings.
Figure 3:
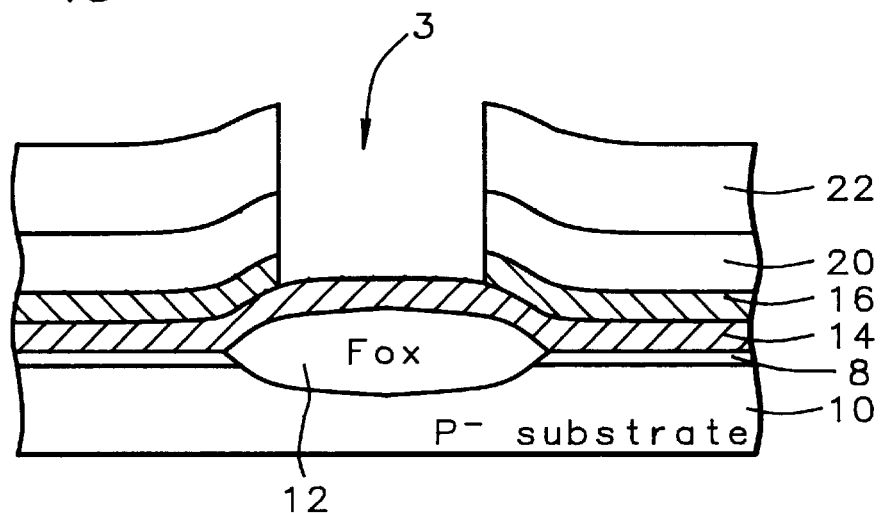
Figure 4:
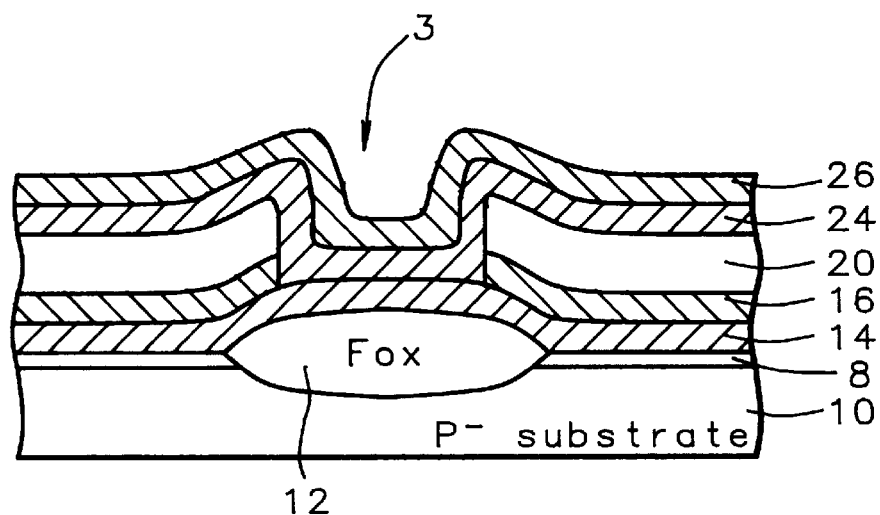

Referring now to FIGS. 2 through 4, a first embodiment of the invention is described for making contacts with low contact resistance between two patterned polycide layers. These polycide layers are used to make electrical interconnections on integrated circuits. The series of steps for forming the contacts having this low contact resistance begins by providing a semiconductor substrate 10, a portion of which is shown in FIG. 2 having a partially completed device. The substrate is preferably composed of a single-crystal silicon having a <100> crystallographic orientation. Either a P type or an N type conductively doped substrate can be used for the purpose of this invention, or alternately the substrate can have P wells or N wells for forming CMOS-type integrated circuits. However, to simplify the discussion, only a P⁻ substrate is shown in FIG. 2 for providing N channel FETs. The method of this invention is shown for making contacts with low contact resistance to a first polycide layer that also serves as the gate electrode for an N channel FET.

Still referring to FIG. 2, a field oxide 12 (FOX) is used to isolate the device areas, but only a portion of the FOX is shown between two device areas. A conventional method for forming the FOX is by the method of LOCal Oxidation of Silicon (LOCOS). In this method, a patterned silicon nitride ($Si_3N_4$) layer is deposited over the device areas and is used as a barrier to oxidation. The substrate is then thermally oxidized in the exposed field oxide areas to form a relatively thick silicon oxide ($SiO_2$) having a thickness of about 4000 to 5000 Angstroms.

Still referring to FIG. 2, after removing the silicon nitride from the device area, a thin oxide 8 is thermally grown on the device area to form the gate oxide for the FETs. Typically, the gate oxide is between about 60 and 200 Angstroms. A blanket first polysilicon layer 14 is deposited on the substrate over the gate oxide 8 and on the FOX 12. The preferred thickness of the first polysilicon layer is preferably between about 500 and 1500 Angstroms. The polysilicon layer 14 is deposited by Low Pressure Chemical Vapor Deposition (LPCVD). The polysilicon layer 14 is then doped by ion implantation using phosphorus ($p^{31}$) or arsenic ($As^{75}$) ions. Preferably the dopant concentration is between about 1.0 E 19 and 1.0 E 21 ions/cm$^3$, and is implanted at an energy in the range of 30 to 50 keV.

Continuing with FIG. 2, a first silicide layer 16 is then deposited on the blanket first polysilicon layer 14 to form the first polycide layer, which further improves the electrical conductivity. Preferably the silicide layer is composed of a tungsten silicide ($WSi_2$) having a thickness of about 500 to 2000 Angstroms. One preferred method for forming the silicide layer is by Chemical Vapor Deposition (CVD) using, for example, tungsten hexafluoride ($WF_6$) and silane ($SiH_4$). The tungsten silicide layer is used to improve the electrical conductivity of the first polycide layer.

Photolithographic techniques and anisotropic plasma etching are now used to pattern the first polycide layer composed of the first polysilicon layer 14 and the first silicide layer 16. The cross section of the polycide layer is along the length of the patterned portion and is not obvious in FIG. 2. This patterned polycide layer is commonly used to form the gate electrode for the FET over the gate oxide 8 in the device area, portions of which are shown in FIG. 2. The patterned first polycide layer also extends over the field oxide regions also forming the first level of interconnecting metallurgy. Although the method of this invention is described for making contacts with low resistance to the first polycide layer used for FET gate electrodes, it should be well understood by those skilled in the art that the method is generally applicable to making low contact resistance contacts between any two polycide layers on the substrate. Typically the formation of the FETs involves additional processing steps, which are not essential for this invention, and which are only briefly described to simplify the discussion, and yet to show the processing continuity for this invention. For example, after forming the gate electrodes from the first polycide layer, lightly doped drains (LDD) are formed adjacent to the electrodes by ion implantation. Then insulating sidewall spacers are formed, for example, by depositing a silicon oxide layer (CVD oxide) over the gate electrodes, and then blanket etching back the CVD oxide to form the sidewall spacers. The FET source/drain contact areas are heavily doped by implanting a dopant adjacent to the sidewall spacers to make good FET contacts, thereby completing the FET. These process steps are not depicted in the cross section shown in FIG. 2.

Continuing with the invention, an insulating layer 20, as shown in FIG. 2, is deposited over the patterned first polycide layer to insulate the first polycide layer from the next level of interconnections. Preferably the insulating layer 20 is composed of a silicon oxide ($SiO_2$) and is deposited, for example, by LPCVD in a reactor by the decomposition of tetraethosiloxane (TEOS). The preferred thickness of the insulating layer 20 is between about 500 and 2000 Angstroms. Although the drawings depict an insulating layer that is conformal, the method equally applies to insulating layers that are planarized. A photoresist layer 22 is now coated over the insulating layer 20, and patterned to form openings in the desired contact areas, as shown in FIG. 2.

By the prior art, contact openings would be typically etched in the insulating layer 20 to the surface of the silicide layer 16 on the underlying patterned polycide layer. This generally results in contacts that have high contact resistance with wide variations in resistive values. The high values and wide variations in contact resistance are typically due to the presence of polymers and other residues on the tungsten silicide ($WSi_2$) layer 16 which are difficult to remove. Interface treatments, such as etching in a hydrofluoric (HF) acid solution, plasma etching in $CH_4$ and $O_2$ and the like, are generally ineffective and add additional cost to the manufacturing process.

By the method of this invention, and as shown in FIG. 3, the contact opening 3 is now etched in the insulating layer 20 by using the photoresist mask 22 and anisotropic plasma etching. The plasma etching is also continued in the same etcher to completely remove the first silicide layer 16 and partially etch into the underlying first polysilicon layer 14. The preferred etching is performed in a Reactive Ion Etcher (RIE) to provide anisotropic etching, and the etching gas in a mixture, such as carbon tetrafluoride ($CF_4$) and oxygen ($O_2$). Etching into the first polysilicon layer eliminates the need for any further interface treatments to clean the contacts, or the need for additional doping of the contacts. For example, the method provides contacts having only about 200 to 500 ohms of resistance for a contact opening having a diameter of only 0.4 micrometer (um), which is a significant improvement over the prior art contacts that have resistance values well over 2000 ohms and large variations in resistive values.

The exposed contacts are then subjected to a short HF acid etch before depositing the second polysilicon layer.

Referring now to FIG. 4, the method continues by subjecting the exposed polysilicon layer 16 in the contact openings to a short HF acid etch and then photoresist layer 22 is stripped. A second polysilicon layer 24 is deposited over the insulating layer 20 and into the contact openings 3 making contact with the first polysilicon layer 14. The first polysilicon-to-second polysilicon interface provides the desired low contact resistance. Preferably, the second polysilicon layer 24 is deposited using LPCVD, similar to the deposition of the first polysilicon layer 14 having a preferred thickness of about 500 to 3000 Angstroms. The second polysilicon is now conductively doped, such as by implanting $P^{31}$ ions, or alternatively by in-situ doping during the LPCVD deposition of the polysilicon by adding a dopant gas, such as phosphine ($PH_3$) to the silane ($SiH_4$). The preferred dopant concentration in the second polysilicon layer is about 1.0 E 19 to 1.0 E 21 atoms/cm$^3$.

Still referring to FIG. 4, a second silicide layer 26 is deposited on the second polysilicon layer 24 thereby forming a second polycide layer. The second silicide layer 26 is deposited similar to the first silicide layer 16, for example, using LPCVD and tungsten hexafluoride and silane. The silicide layer 26 is not required to form the low contact resistance contacts, but is commonly practiced in the semiconductor industry to further reduce the line resistance. The preferred thickness of layer 26 is about 500 to 2000 Angstroms. Using conventional photolithography techniques and anisotropic plasma etching, the second polycide layer composed of layers 24 and 26 is patterned to complete the second level of interconnections. This completes the two levels of patterned polycide interconnections having the much improved contacts with low contact resistance.

Figure 5:
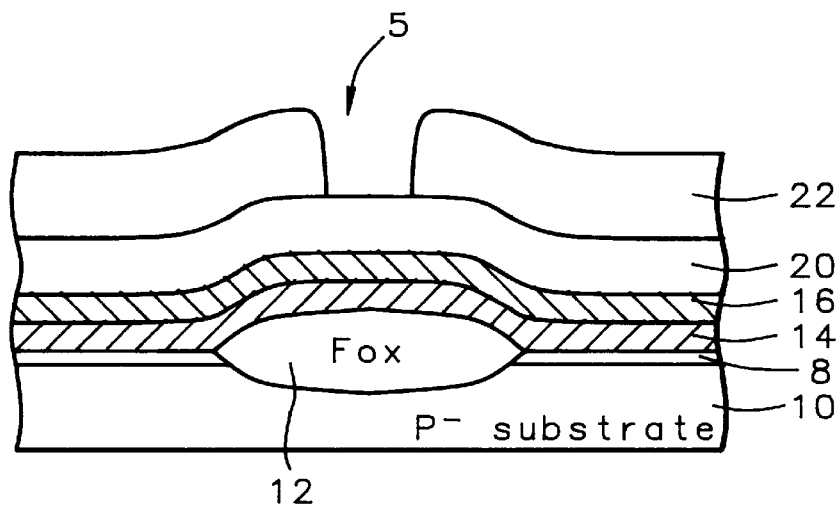
FIGS. 5 through 7 are schematic cross-sectional views showing a second embodiment process and resulting structure for forming the two levels of polycide interconnections wherein the contact openings are etched to the surface of the underlying field oxide (FOX) regions.
Figure 6:
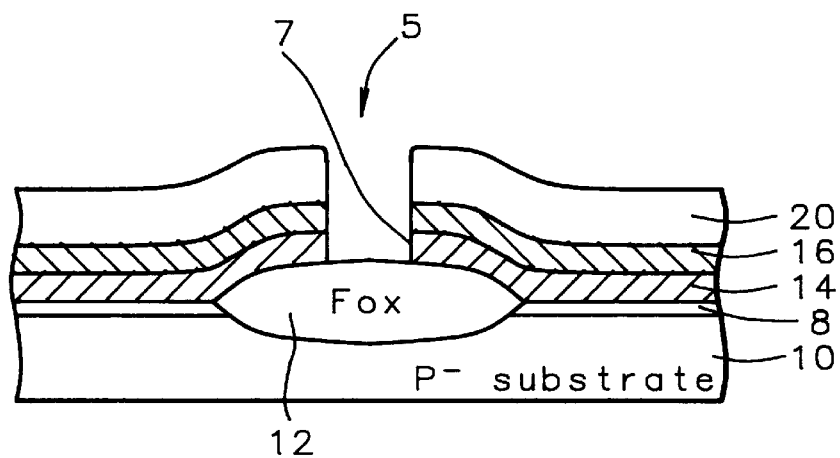
Figure 7:
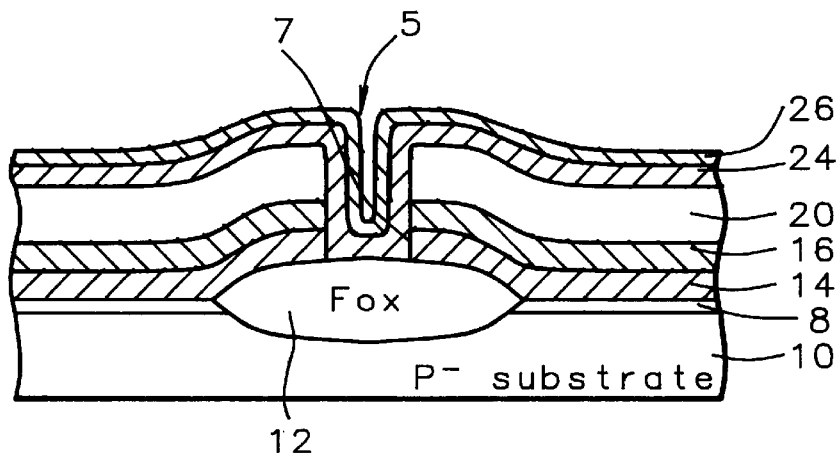

Referring now to FIGS. 5 through 7, a second embodiment is described for a method and resulting structure for forming contacts having low contact resistance ($R_c$) between patterned polycide layers. The method is similar to the first embodiment except for the method of etching the contact openings. Therefore all layers are numbers the same as in the first embodiment, and FIG. 5 is identical to FIG. 2 of the first embodiment just prior to the etching of the contact openings. In this embodiment the contact openings are restricted to be formed over an insulating layer, such as the field oxide regions, since after the contact openings are etched in the insulating layer 20, the first polycide layer comprised of layers 14 and 16 is also completely removed in the contact openings to the field oxide regions.

Referring to FIG. 5, and as shown in FIG. 2, the polycide layer composed of the doped polysilicon layer 14 and silicide layer 16 is deposited on the substrate 10 over the field oxide regions 12 and over the FET gate oxide 8 (partially shown in FIG. 5). After patterning the polycide layer and completing the process steps to form the FET (LDD, sidewall spacers, and source/drain contacts not shown) an insulating layer 20 is deposited. A photoresist layer is coated on the layer 20 and conventional photolithography is used to form the etch mask 22 having openings 5 aligned over the FOX.

Now contact openings are anisotropically etched in the insulating layer 20. The etching is continued removing completely the silicide layer 16 and the polysilicon layer 14 to the surface of the FOX 12. (Only one contact opening 5 of the many contacts formed is depicted in the Figs.) The anisotropic etching forms vertical sidewalls in the polycide layer exposing the sidewall 7 of the doped polysilicon layer 14 in the contact opening 5, as shown in FIG. 6.

The two levels of polycide interconnections are now completed by depositing a second polysilicon layer 24, which is conductively doped, and a polycide layer 26, such as $WSi_2$. The two layers are patterned by photolithographic means and anisotropic etching to form the second level of polycide interconnections. Since a low resistance ohmic polysilicon-to-polysilicon interface is formed between the doped second polysilicon 26 and the sidewall 7 of the doped first polysilicon layer, contacts having low contact resistance ($R_c$) with tight distribution is achieved. The field oxide regions serve as an etch-stop layer. The etching of the polysilicon layer 14 in the contact opening 5 to the surface of the FOX 12 allows considerable latitude in overetching, thereby providing a very manufacturable process.

EXAMPLES

Figure 8:
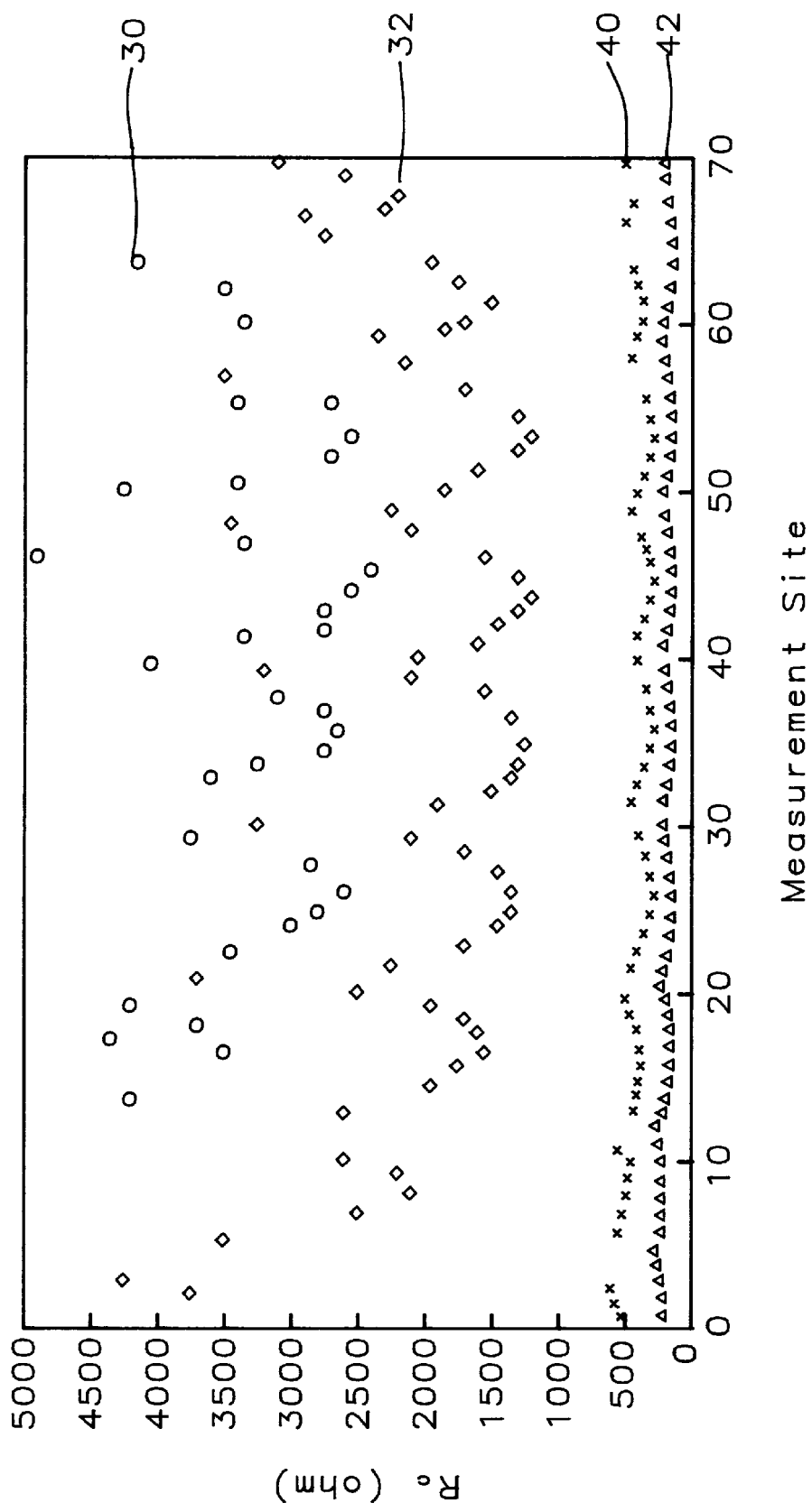
FIG. 8 is a graph of the contact resistance ($R_c$) in ohms versus measurement sites for test wafers comparing the prior art to the results of this invention.

The example in FIG. 8 shows the results for a test structure of the first embodiment and control structures made by the prior art. The graph is FIG. 8 is a plot of the contact resistance ($R_c$) in ohms versus 70 measurement sites. The test structures were formed having a field oxide that was 4000 Angstrom thick. The first polysilicon layer was deposited to a thickness of 1000 Angstroms. The first silicide layer was deposited to a thickness of 1000 Angstroms. The insulating layer was deposited to a thickness of 1000 Angstroms. The contact openings for the first embodiment of this invention were then etched in the insulating layer and through the first silicide layer to the surface of the first polysilicon layer. The control wafer has contacts etched to the surface of the first silicide layer. The contact openings in both the test wafer and the control wafer were then subjected to a hydrofluoric (HF) acid/water (1:100) etch before the photoresist mask used to open the contact openings was stripped. The contact resistance ($R_c$) was then measured using an $R_c$ loop test. Each measurement site in FIG. 8 is for one site on the wafer, with each measurement site consisting of 2,000 contacts connected in series. The contact resistance ($R_c$) is the average resistance for one contact. As can be seen in the graph in FIG. 8 by the data points labeled 30, the contact resistance varies from about 2500 ohms to as high as 4900 ohmsfor a contact having a 0.4 um diameter, and for contacts made by the prior art having a diameter of 0.5 um, the contact resistance varies from about 1300 ohms to about 4300 ohm, and these data points are labeled as 32 on the graph.

The contact resistance ($R_c$), by the method of this invention, is also shown in the graph in FIG. 8. As can be seen by the data points labeled 40, for the contacts having 0.4 um diameter, the contact resistance varies from about 250 ohms to about 700 ohms, and for the measurements for the 0.5 um diameter contact openings, the contact resistance as shown by the data points labeled 42, is about 200 ohms, with very little variation in resistive value. The method of this invention clearly provides a much improved contact between polycide layers.

While the invention has been particularly shown and described with reference to the preferred embodiments thereof, it will be understood by those skilled in the art that various changes in form and details may be made without departing from the spirit and scope of the invention.

What is claimed is:

1. A method for fabricating improved electrical contacts between multilevels of patterned polycide layers for interconnections on integrated circuits, comprising the steps of:

providing a semiconductor substrate having field oxide regions surrounding and electrically isolating device areas;

depositing a first polysilicon layer on said field oxide regions and said device areas;

doping and making electrically conductive said first polysilicon layer;

depositing a first silicide layer on said first polysilicon layer;

masking and anisotropically etching said first silicide and said first polysilicon layers and thereby forming a patterned first polycide layer;

depositing an insulating layer on said patterned first polycide layer thereby electrically insulating said patterned first polycide layer;

photoresist masking and anisotropically plasma etching contact openings in said insulating layer aligned over said field oxide regions, and by continuing said plasma etching selectively removing said first silicide layer and said first polysilicon layer down to said field oxide regions in said contact openings, thereby providing a surface for making consistently low contact resistance;

depositing a second polysilicon layer and doping said second polysilicon layer to form an electrically conducting layer, said second polysilicon layer electrically contacting said first polysilicon layer in said contact openings;

depositing a second suicide layer on said second polysilicon layer, thereby forming a second polycide layer;

patterning, by photoresist masking and anisotropic plasma etching, said second polycide layer, thereby completing said improved electrical contacts between said multilevels of patterned polycide layers.

2. The method of claim 1, wherein said first polysilicon layer is between about 500 and 1500 Angstroms thick and is doped with N+ dopant having a concentration of between about $1.0 \times 10^{19}$ and $1.0 \times 10^{21}$ atoms/cm$^3$.

3. The method of claim 1, wherein said first silicide layer is composed of tungsten silicide and is between about 500 and 2000 Angstroms thick.

4. The method of claim 1, wherein said insulating layer is silicon oxide deposited by chemical vapor deposition (CVD) having a thickness of between about 500 and 2000 Angstroms.

5. The method of claim 1, wherein said anisotropic etching is performed in a reactive ion etcher using an etch gas mixture composed of carbon tetrafluoride (CF$_4$) and oxygen.

6. The method of claim 1, wherein said second polysilicon layer is between about 500 and 3000 Angstroms thick and is doped with N+ dopant having a concentration of between about $1.0 \times 10^{19}$ and $1.0 \times 10^{21}$ atoms/cm$^3$.

7. The method of claim 1, wherein said patterned first polycide layer forms, in part, the gate electrodes for field effect transistors (FETs) and first level electrical interconnections.

* * * * *